(12) United States Patent
Kawasaki

(10) Patent No.: US 9,197,169 B2
(45) Date of Patent: Nov. 24, 2015

(54) CURRENT REUSE AMPLIFIER

(71) Applicant: Sumitomo Electric Industries, Ltd., Osaka-shi (JP)

(72) Inventor: Takeshi Kawasaki, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 57 days.

(21) Appl. No.: 14/039,130

(22) Filed: Sep. 27, 2013

(65) Prior Publication Data

US 2014/0091863 A1    Apr. 3, 2014

(30) Foreign Application Priority Data

Sep. 28, 2012    (JP) .................................. 2012-217131

(51) Int. Cl.
    *H03F 3/16*    (2006.01)
    *H03F 1/02*    (2006.01)
    *H03F 3/193*   (2006.01)

(52) U.S. Cl.
    CPC ................ *H03F 3/16* (2013.01); *H03F 1/0283* (2013.01); *H03F 3/193* (2013.01)

(58) Field of Classification Search
    CPC .................................. H03F 3/191; H03F 3/193
    USPC ........................................... 330/302, 310, 311
    See application file for complete search history.

(56) References Cited

U.S. PATENT DOCUMENTS

| | | | | |
|---|---|---|---|---|
| 4,241,316 | A * | 12/1980 | Knapp ........................... | 330/277 |
| 6,670,801 | B2 * | 12/2003 | Jian et al. ......................... | 324/95 |
| 7,948,324 | B2 * | 5/2011 | Buer et al. ..................... | 330/310 |
| 8,138,835 | B2 * | 3/2012 | Zeng et al. ..................... | 330/296 |
| 8,305,139 | B1 * | 11/2012 | Dykstra ........................... | 330/51 |

FOREIGN PATENT DOCUMENTS

JP    2008-035083 A    2/2008

* cited by examiner

*Primary Examiner* — Steven J Mottola
(74) *Attorney, Agent, or Firm* — Venable LLP; Michael A. Sartori; Trent B. Ostler

(57) ABSTRACT

A current reuse amplifier is disclosed. The amplifier includes a first field effect transistor (FET); and a second FET with a source coupled with a gate of the second FET and a drain of the first FET through a first resistor in a DC mode but floated from a ground in an AC mode. A feature of the current reuse amplifier is that the amplifier further includes a shunt block connected in the source of the second FET to shunt a DC current flowing in the second FET to the ground. A DC current flowing in the first FET is smaller than a DC current flowing in the second FET, and the first FET has a size smaller than a size of the second FET.

18 Claims, 10 Drawing Sheets

CURRENT REUSE AMPLIFIER

BACKGROUND OF THE INVENTION

1. Field of the Invention

The present application relates to an amplifier circuit, in particular, the application relates to a type of, what is called, the current reuse amplifier.

2. Related Background Art

A current reuse amplifier has been well known in the field, where a current supplied to the downstream stage is commonly guided to the upstream stage. A Japanese Patent Application published as JP-2008-035083A has disclosed one type of the current reuse amplifier. One of advantages of the current reuse amplifier is that two or more transistors in respective stages are connected in series between a power supply and the ground, which effectively suppresses the current consumption of the amplifier.

In a low noise amplifier (LNA) and/or a power amplifier with the multi-stage arrangement, the first stage transistor preferably has a smaller size compared to transistors in the second or the downstream stages in order to enhance the noise figure (NF), while, transistors in the downstream stages preferably has a larger size to enhance the linearity thereof. In the current reuse amplifier, however, because the DC current commonly flows in transistors in the first stage and the second or downstream stages, the transistors are necessary to have the size same to each other. When the second or the downstream transistors have the size same to that of the first stage, the downstream transistors easily saturate and become unable to show enough linearity. On the other hand, when the first transistor has the size same with those of the downstream transistors, the first transistor shows a degraded NF because of inadequate biases.

SUMMARY OF THE INVENTION

An amplifier of the present application is a type of, what is called, a current reuse amplifier that includes a front end stage and at least one downstream stage. The front stage and the downstream stage include a transistor and are connected in series in the DC mode between the power supply and the ground. The amplifier of the present application has feature that a shunt block is further included. The shunt block is connected in series to the downstream stage and in parallel to the front end stage to shunt the current flowing in the downstream stage to the ground. Thus, the DC current flowing in the front end stage is smaller than the DC current flowing in the downstream stage.

Specifically, the current reuse amplifier of the application includes the first field effect transistor (FET) as the front end stage and the second FET in the downstream stage. The source of the second FET is coupled with the gate of the second FET and the drain of the first FET through a resistor in the DC mode but grounded only in the AC mode. The shunt block is connected in the source of the second FET to shunt the DC current flowing in the second FET to the ground. Thus, the DC current flowing in the first FET is smaller than the DC current flowing in the second FET.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

DESCRIPTION OF THE PREFERRED EMBODIMENTS

Figure 1:
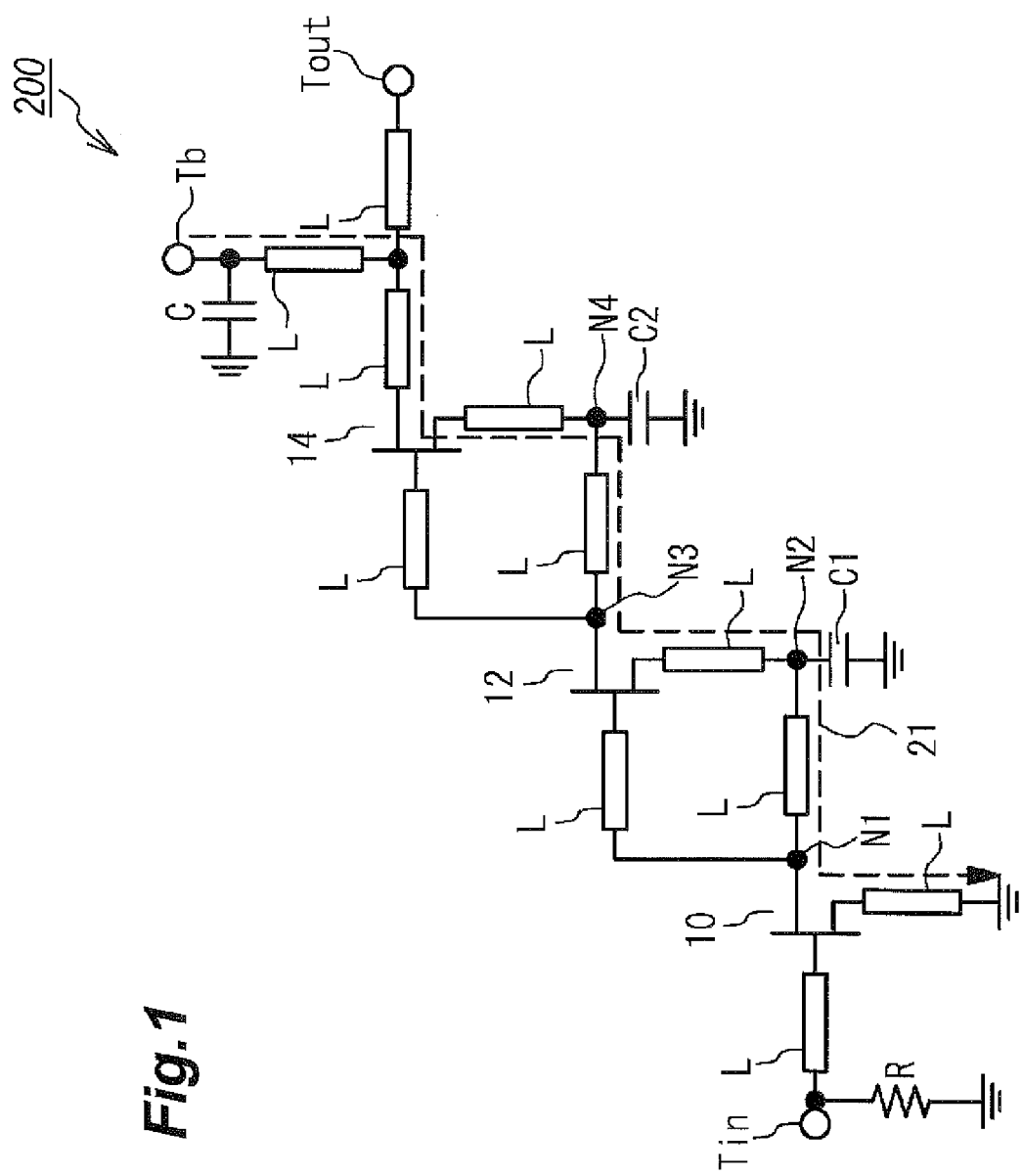
FIG. 1 is a circuit diagram of an amplifier comparable to embodiments of the invention.

FIG. 1 is a circuit diagram of a high frequency circuit according to a comparable embodiment of the present invention. As shown in FIG. 1, the high frequency circuit 200 has an arrangement of the three-stage amplifier with transistors, 10 to 14, of a field effect transistor (FET).

The first transistor 10 is grounded in the source and coupled with an input Tin of the amplifier 200 in the gate thereof. The second transistor 12 is also grounded in the source through a capacitor C1 and connected in the gate thereof to the drain of the first transistor 10 at a node N1. The node N1 of the drain of the first transistor 10, which is connected to the gate of the second transistor 12, is electrically connected to the node N2 between the source of the second transistor 12 and the capacitor C1.

The third transistor 14 in the source thereof is grounded through a capacitor C2 and in the gate thereof is connected to the drain of the second transistor 12, while in the drain thereof is coupled to the output Tout of the amplifier 200. The node N3 of the drain of the second transistor 12 is connected to the node N4 between the source of the third transistor 14 and the capacitor C2. A node between the drain of the third transistor 14 and the output Tout is externally biased by a power supply Tb. Distributed parameter elements L, or distributed parameter lines, connect between respective transistors, 10 to 14, between the input Tin and the first transistor 10, and between the third transistor 14 and the output Tout. Distributed parameter lines L adjust the impedance to match elements connected thereto. A resistor R put between the input Tin and the ground matches resistive components of the input Tin, while, a capacitor C is a bypassing capacitor to reduce noises with high frequencies.

The first transistor 10 amplifies a signal input to the gate thereof and outputs an amplified signal in the drain. The second and third transistors, 12 and 14, amplify signals put in respective gates and outputs amplified signals in the drains. Thus, the amplifier 200 amplifies a high frequency signal provided in the input Tin by the three stages and output thus amplified signal in the output Tout. Two capacitors, C1 and C2, cut DC currents flowing in the second and third transistors, 12 and 14. The DC current I0 provided from the external bias Tb flows into the ground through the drain and source of the third transistor 14, the nodes, N4 and N3, the drain and source of the second transistor 12, the nodes, N2 and N1, and the drain and source of the first transistor 10.

Three transistors, 10 to 14, in the amplifier 200 commonly use the DC current, which suppresses the current consumption of the circuit and often called as a current reuse amplifier. However, in the current reuse amplifier like the circuit 200, all transistors, 10 to 14, are necessary to have a common gate width in order to set the gate biases for respective transistors to be an optimum point.

First Embodiment

Figure 2:
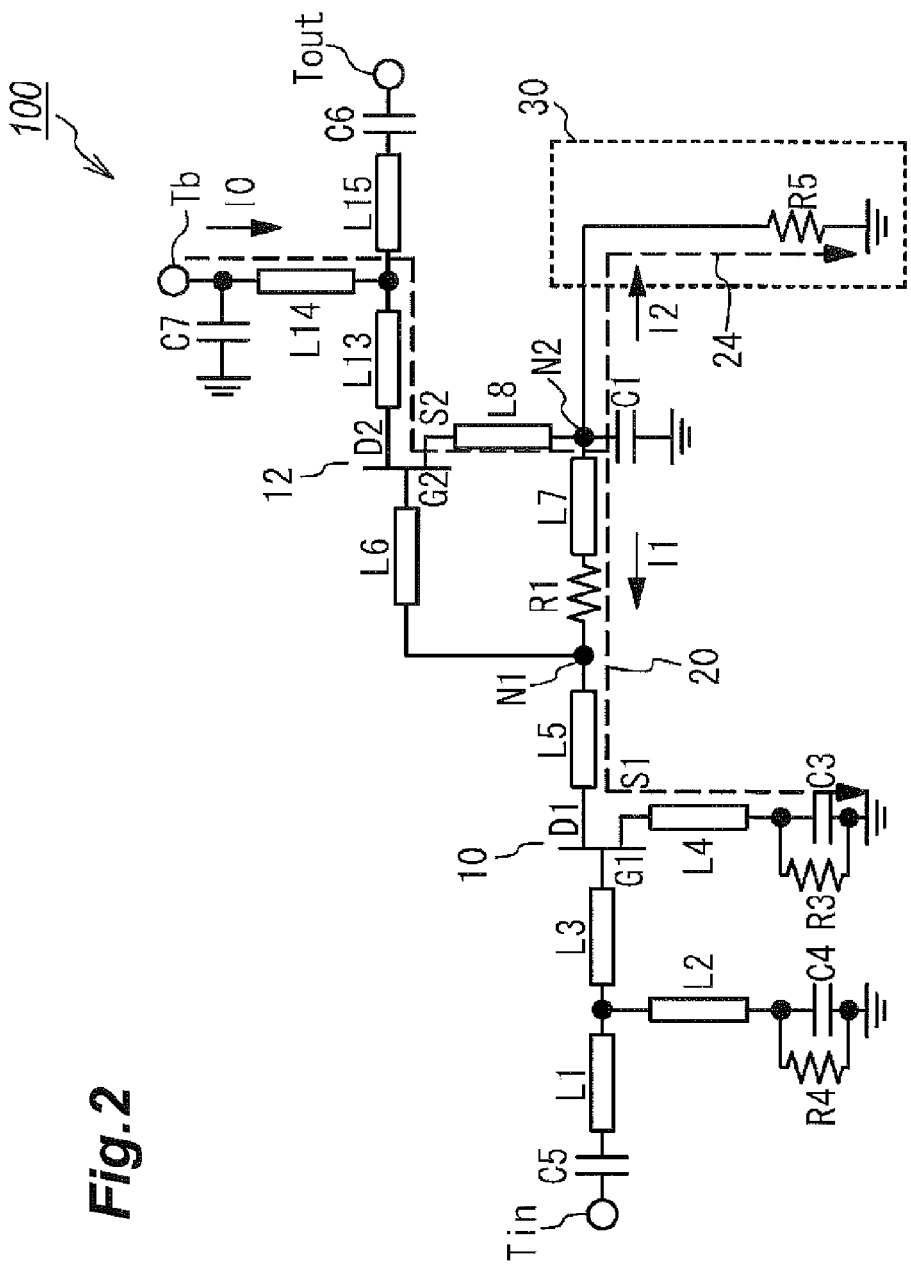
FIG. 2 is a circuit diagram of an amplifier according to the first embodiment of the invention.

FIG. 2 shows a circuit diagram of an electronic circuit according to an embodiment of the present invention, where the circuit 100 shown in FIG. 2 has a configuration of the two-stage amplifier. The circuit 100 provides a series circuit of a capacitor C5 and two distributed parameter lines, L1 and L3, between the input Tin and the gate G1 of the first transistor 10. A node between two distributed parameter lines, L1 and L3, is grounded thorough a series circuit of another distributed parameter line L2 and a parallel circuit comprised of a resistor R4 and a capacitor C4. These circuit elements of distributed parameter lines, L1 to L3, the resistor R4 and the capacitor C4, operates as an impedance matching circuit for the input Tin. The resistor R4 sets a DC bias supplied to the gate G1, while, the capacitor C4 is a bypassing capacitor to suppress high frequency noises.

The source S1 of the first transistor 10 is grounded through a series circuit of a distributed parameter line L4 and a parallel circuit comprises of a resistor R3 and a capacitor C3. The resistor R3 sets the source bias for the first transistor 10; while, the capacitor C3 grounds the source S1 in the AC mode. The drain D1 of the first transistor 10 is coupled with the gate G2 of the second transistor 12 in both of the DC and AC modes through a series circuit of two distributed parameter lines, L5 and L6.

The source S2 of the second transistor 12 is grounded through a distributed parameter line L8 and a capacitor C1 in the AC mode but is floated in the DC mode. The node N1 between two distributed parameter lines, L5 and L6, is coupled with a node N2, which is between the source S2 and the capacitor C1, through a series circuit of a resistor R1 and a distributed parameter line L7. Elements of distributed parameter lines, L5 to L8, and a resistor R1 operate as an impedance matching circuit between the drain D1 and the gate G2. The resistor R1 sets the gate bias G2 of the second transistor 12, or the drain bias of the first transistor 10.

Two distributed parameter lines, L13 and L15, and a capacitor C6 are provided between the drain D2 of the second transistor 12 and the output Tout. A node between two distributed parameter lines, L13 and L15, is biased by an external power supply Tb, which is bypassed by a capacitor C7, through another distributed parameter line L14. Circuit elements of distributed parameter lines, L13 to L15, operate as a matching circuit for the impedance of the output Tout. The capacitor C6 is a coupling capacitor to cut DC signals.

A feature of the amplifier 100 shown in FIG. 2 is that the amplifier 100 further provides a shunt block 30 at the node N2. The shunt block 30, which includes a resistor R5, divides a current flowing into the node N2 into two currents, one flows into the ground while the other flows into the first transistor 10.

Figure 3:
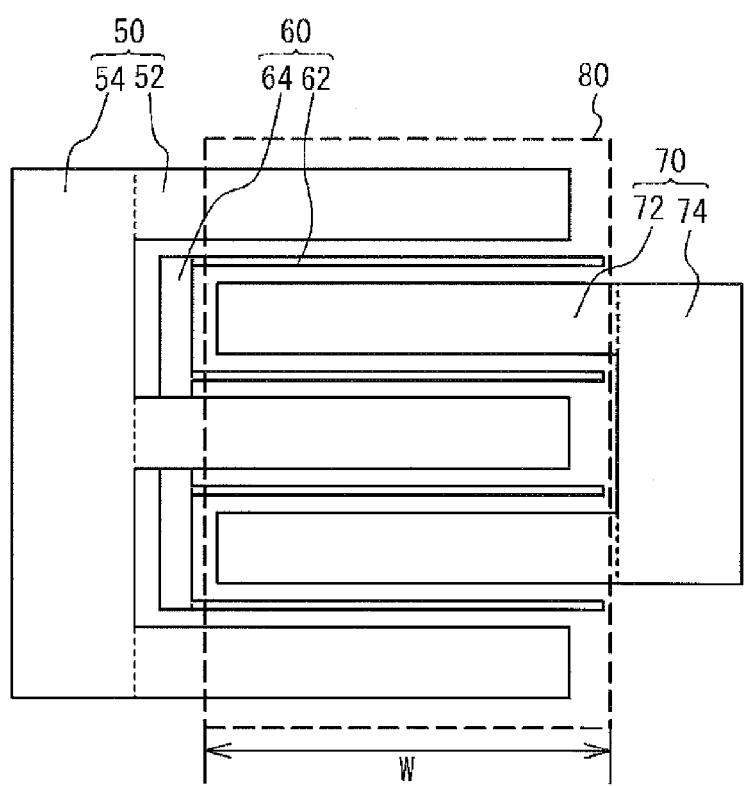
FIG. 3 shows a plan view, or a layout diagram, of a transistor implemented within amplifiers of the embodiments.

FIG. 3 is a plan view of transistors provided in respective embodiments 1 to 6. The transistor provides source 50, gate, 60, and drain 70 electrodes. The source electrode 50 includes a plurality of fingers 52 and a bus bar 54 connecting respective fingers 52. The gate electrode 60 also provides a plurality of fingers 62 and a bus bar 64 connecting respective fingers 62. Similarly, the drain electrode 70 includes a plurality of fingers 72 and a bus bar 74 connecting the fingers 72. Respective fingers, 52, 62, and 72, are formed within an active area 80. A transistor having an arrangement thus described above is often called as the multi-finger FET, where a width of the active area 80 corresponds to the gate width W. The width W multiplied by the number of gate fingers 62 becomes the gate width.

In FIG. 2, the first transistor 10 amplifies a high frequency signal input to the gate G1 thereof, and outputs thus amplified signal from the drain D1. The second transistor 12 also amplifies a high frequency signal input to the gate G2, and outputs an amplified signal from the drain D2. Distributed parameter lines are regarded as short circuit in the DC mode, while, capacitors are ignorable in the DC mode. Accordingly, the current supplied from the external source Tb flows into the ground passing a current path 20 including the drain D2 and the source S2 of the second transistor 12, the resistor R1, the drain D1 and the source S1 of the first transistor 10, and the resistor R3, which is the first current path. Moreover, a portion I2 of the DC current I0 flows into the ground from the node N2 passing the current path 24. Thus, the DC current I1 flowing in the first transistor 10 becomes smaller than the current I0 flowing in the second transistor 12.

Table 1 lists examples of lengths of the distributed parameter lines L1 to L15, the capacitance of capacitors C1 to C7, the resistance of resistors R1 to R5, finger widths and numbers of the transistors, 10 and 12, and a magnitude of the DC current, I0 to I2. Table 1 assumes that the transmission impedance of the distributed parameter lines is 50Ω. FIG. 3 is a plan view of transistors, 10 and 12, where the transistors have lengths of 5 μm for the fingers, 52 and 72, which corresponds to the source and/or drain, while, a length of 1 μm for the finger 62, which corresponds to the gate. The layout shown in FIG. 3 has a distance between the source and the gate, and between the drain and the source to be 1 μm. The external supply Tb is set to be 5V.

TABLE 1

| | | L1 | L2 | L3 | L4 | L5 | L6 | L7 | L8 | L13 | L14 | L15 |
|---|---|---|---|---|---|---|---|---|---|---|---|---|
| distributed parameter lines (μm) | | 140 | 70 | 40 | 40 | 120 | 10 | 80 | 10 | 60 | 80 | 120 |
| Resistor (Ω) | | R1 | R3 | R4 | R5 | | | | | | | |
| | | 10 | 10 | 50 | 150 | | | | | | | |
| Capacitor (pF) | | C1 | C3 | C4 | C5 | C6 | C7 | | | | | |
| | | 1.8 | 1.8 | 1.5 | 0.5 | 0.3 | 3.0 | | | | | |
| Transistor | | 12 | 14 | | | | | | | | | |
| finger width (μm) | | 20 | 40 | | | | | | | | | |
| finger counts | | 4 | 4 | | | | | | | | | |
| DC Current (mA) | | I0 | I1 | I2 | | | | | | | | |
| | | 20 | 10 | 10 | | | | | | | | |

According to the first embodiment shown in FIG. 2, the resistor R1 is put between two nodes, N1 and N2; and the capacitor C1 is put between the source S2 and the ground. The current path 20 provides the DC current to the drain of the first transistor 10 through the drain D2 and the source S2 of the second transistor 12, the node N2, the resistor R1, and the node N1. Also, the shunt block 30 is set in parallel to the first transistor 10 from the current path 20 between two transistors, 10 and 12. Accordingly, a portion I2 of the current I1 flowing in the second transistor 12 is shunt to the shunt block 30, which decreases the current I1 flowing in the first transistor 10 compared with the current I0 flowing in the second transistor 12. Thus, the size of the first transistor 10, for instance, the gate width of the first transistor 10 may be shorter than that of the second transistor 12, which enables for the size of the first transistor 10 so as to optimize the noise figure (NF), while, the size of the second transistor so as to enhance the linearity.

The shunt block 30 includes the resistor R5, which enables to make a size of the shunt block small. Although the table 1 assumes the magnitude of the current I1 is equal to the magnitude of the other current I2, that is, the current flowing in the second transistor 12 is evenly shunt to the first transistor 10 and to the shunt block. However, a ratio of two currents, I1 and I2, may be variable.

Second Embodiment

Figure 4:
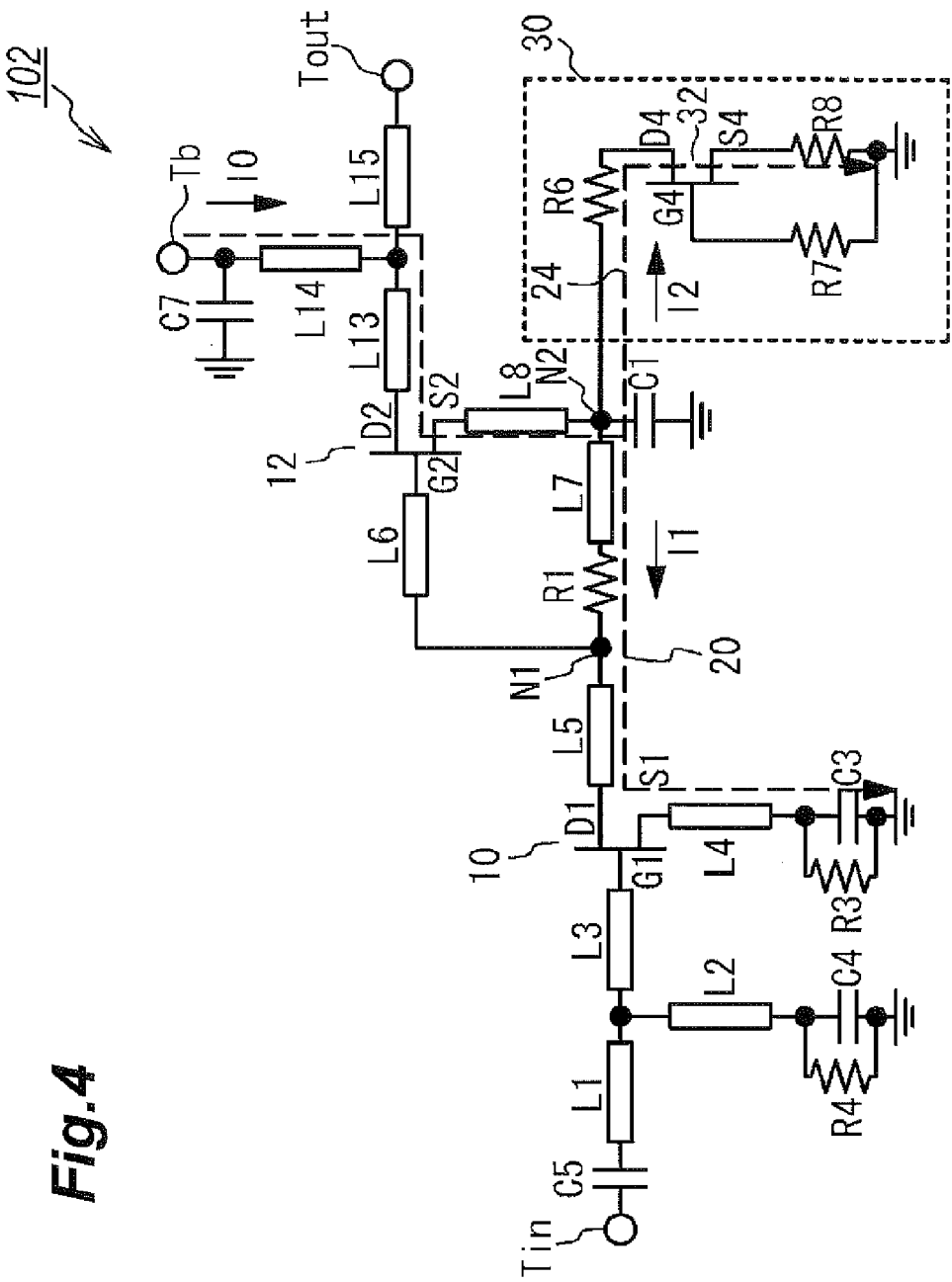
FIG. 4 is a circuit diagram of an amplifier according to the second embodiment.

FIG. 4 is a circuit diagram of a high frequency circuit according to the second embodiment of the invention. The circuit 102 shown in FIG. 4 provides the shunt block 30 including a transistor 32, which is the fourth transistor, and resistors, R6 to R8. The transistor 32 in the source S4 thereof is grounded through the resistor R8, and the gate G4 is as grounded through the resistor R7, while, the drain D4 is coupled with the node N2 through the resistor R6. Other arrangements of the circuit 102 are same as those of the circuit according to the first embodiment shown in FIG. 2, and omit their explanations.

Table 2 below lists parameters of the distributed parameter lines, L1 to L15, the resistance of resistors, R1 to R8, the capacitance of capacitors, C1 to C7, the width and the number of the finger of transistors, 12 to 32, and DC currents I0 to I2.

The shunt block 30 of the second embodiment includes a transistor 32 to set the DC current I2 flowing therein, which effectively suppresses variations of the ratio of two currents, I1 and I2, even the performances of transistors, 10 and 32, varies due to, for instance, the process instability and the temperature dependence thereof.

Moreover, setting the width of the gate finger of the transistor 32 to be equal to the width of the gate finger of the first transistor 10, the sizes of the transistors, 10 and 12, namely, the ratio of the DC currents, I1 and I2, becomes simply adjustable, which facilitates the design of the high frequency circuit.

Third Embodiment

Figure 5:
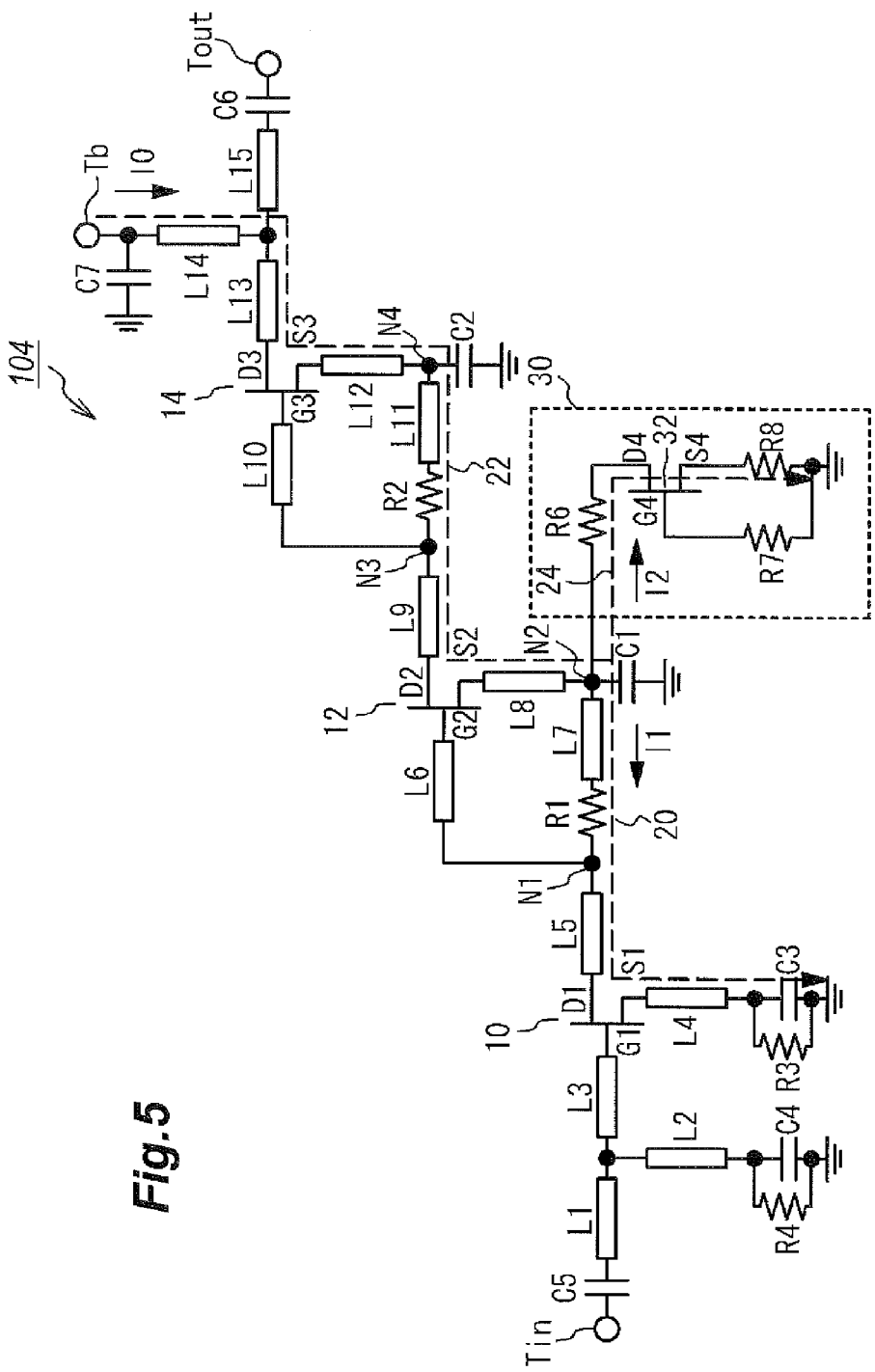
FIG. 5 is a circuit diagram of an amplifier according to the third embodiment.

FIG. 5 is a circuit diagram of an amplifier 104 according to the third embodiment of the invention. The amplifier 104 has the triple stage arrangement, where another transistor 14, which is the third transistor, is put between the second transistor 12 and the output Tout.

The third transistor in the gate G3 thereof couples with the drain D2 of the second transistor 12 through two distributed parameter lines, L9 and L10, in both of the DC and AC modes; while, the source S3 is grounded through a distributed parameter line L12 and a capacitor C2 in the AC mode but is floated in the DC mode. The node N3 between two distributed parameter lines, L9 and L10, is connected to the node N4 through a series circuit of a resistor R2 and a distributed parameter line L11. Distributed parameter lines, L9 to L12, and the resistor R2 operate as an impedance matching circuit between the drain D2 and the gate G3; the resistor R2 sets the gate bias of the third transistor 14 by a voltage drop due to a DC current flowing therein. The output Tout is brought from the drain D3 of the third transistor.

The DC current provided from the external source Tb and flowing in the third transistor 14 is divided into two parts, one of which flows in the first transistor 10, while, the other flows in the shunt block 30 to be soaked into the ground. Specifically, the DC current coming from the external source Tb

TABLE 2

| distributed parameter lines (μm) | L1 | L2 | L3 | L4 | L5 | L6 | L7 | L8 | L13 | L14 | L15 |
|---|---|---|---|---|---|---|---|---|---|---|---|
| | 140 | 70 | 40 | 40 | 120 | 10 | 80 | 10 | 60 | 80 | 120 |
| Resistor (Ω) | R1 | R3 | R4 | R6 | R7 | R8 | | | | | |
| | 10 | 10 | 50 | 150 | 50 | 10 | | | | | |
| Capacitor (pF) | C1 | C3 | C4 | C5 | C6 | C7 | | | | | |
| | 1.8 | 1.8 | 1.5 | 0.5 | 0.3 | 3.0 | | | | | |
| Transistor | 12 | 14 | 32 | | | | | | | | |
| finger width (μm) | 20 | 40 | 20 | | | | | | | | |
| finger counts | 4 | 4 | 4 | | | | | | | | |
| DC Current (mA) | I0 | I1 | I2 | | | | | | | | |
| | 20 | 10 | 10 | | | | | | | | |

In an example, two transistors, 10 and 32, are preferable to have the size thereof to even the DC current, I1 and I2, flowing in these transistors. Also, resistors, R6, R7, and R8, preferably have the resistance equal to that of resistors, R1, R4, and R3, respectively. Setting the parameters of the transistors, 10 and 32, and resistors, R1 to R8, the biases set in respective electrodes of the transistors, 10 and 32, become equal. Thus, in order to optimize the size of the transistors, 10 and 12, which is equivalent to optimize the ratio of two currents, I1 and I2, the size of the transistor 32 and the resistance of the resistors, R6 to R8, are optional.

flows in the drain D3 and the source 53 of the third transistor 14, and the resistor R2 to reach the drain D2 of the second transistor 12, which is the current path 22; and divided into two parts, one of which flows in the first current path 20 including the resistor R1, the drain and source of the first transistor 10, and the resistor R3, while, the other of which flows in the path 24 including the resistor R6, and the drain and source of the transistor 32. Thus, the DC current I1 flowing in the first transistor 10 becomes smaller than the DC current flowing in the second transistor 12. Other arrangements of the third embodiment are same as those of the second embodiment shown in FIG. 4.

Table 3 lists parameters of distributed parameter lines, L1 to L15, the resistance of resistors, R1 to R8, the capacitance of capacitors, C1 to C7, the sizes of transistors, 12 to 32, and the DC currents, I0 to I2.

TABLE 3

| distributed parameter lines (μm) | L1 | L2 | L3 | L4 | L5 | L6 | L7 | L8 | L9 | L10 | L11 |
|---|---|---|---|---|---|---|---|---|---|---|---|
| | 140 | 70 | 40 | 40 | 120 | 10 | 80 | 10 | 20 | 10 | 80 |
| | L12 | L13 | L14 | L15 | | | | | | | |
| | 10 | 60 | 80 | 120 | | | | | | | |
| Resistor (Ω) | R1 | R2 | R3 | R4 | R6 | R7 | R8 | | | | |
| | 10 | 5 | 10 | 50 | 10 | 50 | 10 | | | | |
| Capacitor (pF) | C1 | C2 | C3 | C4 | C5 | C6 | C7 | | | | |
| | 1.8 | 1.8 | 1.8 | 1.5 | 0.5 | 0.3 | 3.0 | | | | |
| Transistor | 12 | 14 | 16 | 32 | | | | | | | |
| finger width (μm) | 20 | 40 | 40 | 20 | | | | | | | |
| finger counts | 4 | 4 | 4 | 4 | | | | | | | |
| DC Current (mA) | I0 | I1 | I2 | | | | | | | | |
| | 20 | 10 | 10 | | | | | | | | |

Figure 6:
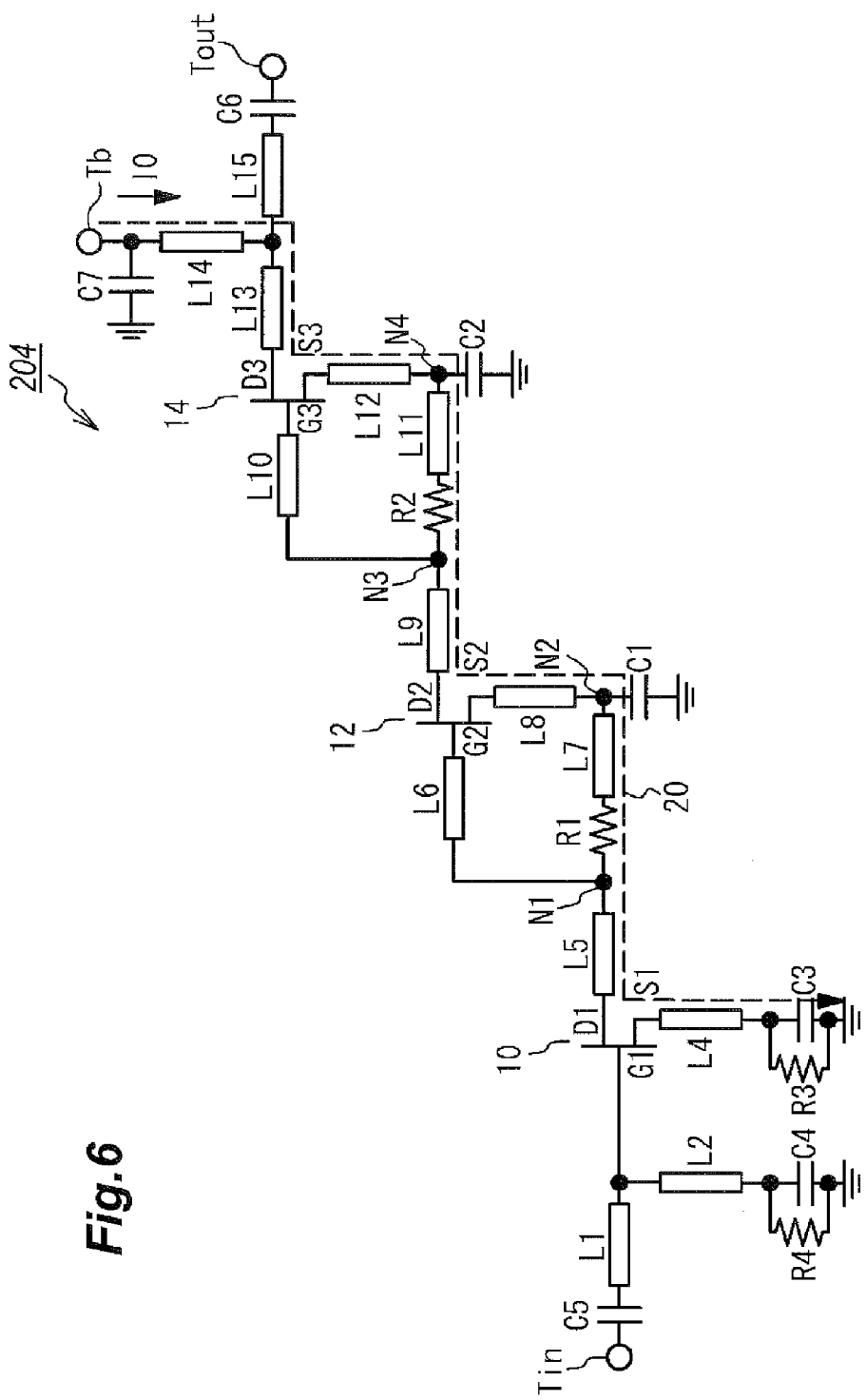
FIG. 6 is a circuit diagram of an amplifier comparable to the third embodiment of the present invention.

FIG. 6 is a circuit diagram with the triple stage amplifier comparable to that shown in FIG. 5. As shown in FIG. 6, the amplifier 204 does not provide any shunt block 30, which means that the DC current I0 flows in all transistors, 10 to 14.

Table 4 lists parameters of the circuit 204, namely, lengths of distributed parameter lines, L1 to L15, the resistance of resistors, R1 to R4, the capacitance of capacitors, C1 to C7, sizes of the transistors, 10 to 14, and the DC current I0 common to all transistors, 10 to 14.

TABLE 4

| distributed parameter lines (μm) | L1 | L2 | L4 | L5 | L6 | L7 | L8 | L9 | L10 | L11 | L12 |
|---|---|---|---|---|---|---|---|---|---|---|---|
| | 120 | 60 | 40 | 120 | 10 | 80 | 10 | 20 | 10 | 80 | 10 |
| | L13 | L14 | L15 | | | | | | | | |
| | 60 | 80 | 120 | | | | | | | | |
| Resistor (Ω) | R1 | R2 | R3 | R4 | | | | | | | |
| | 5 | 5 | 5 | 50 | | | | | | | |
| Capacitor (pF) | C1 | C2 | C3 | C4 | C5 | C6 | C7 | | | | |
| | 1.8 | 1.8 | 1.8 | 1.5 | 0.5 | 0.3 | 3.0 | | | | |
| Transistor | 12 | 14 | 16 | | | | | | | | |
| finger width (μm) | 40 | 40 | 40 | | | | | | | | |
| finger counts | 4 | 4 | 4 | | | | | | | | |
| DC Current (mA) | I0 | | | | | | | | | | |
| | 20 | | | | | | | | | | |

Figure 7A:
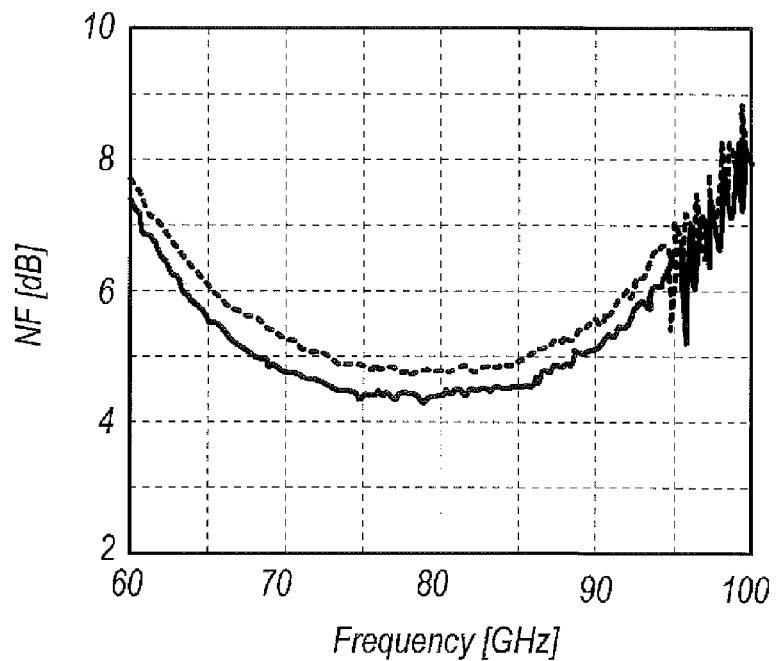
FIGS. 7A and 7B compare performances of the noise figure (FIG. 7A) and the gain (FIG. 7B) between an amplifier of an embodiment of the invention and another amplifier comparable to the present invention.
Figure 7B:
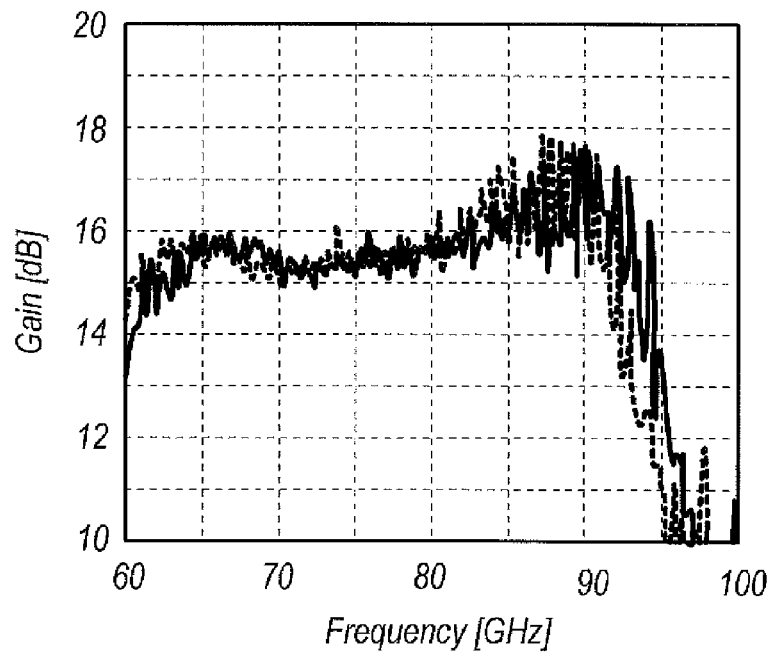

FIGS. 7A and 7B compare the noise figure NF of two amplifiers, 104 and 204, using parameters listed in tables 3 and 4. Transistors, 10 to 32, are assumed to be, what is called, a HEMT (High Electron Mobility Transistor) with a channel layer made of InGaAs and a carrier supplying layer made of AlGaAs.

FIG. 7A compares the NF, while, FIG. 7B compares the gain of two amplifiers, where, solid lines correspond to results of the amplifier shown in FIG. 5 according to the present invention and broken lines correspond to results of the comparable amplifier shown in FIG. 6. As shown in FIG. 7A, the amplifier 104 with the shunt block 30 reduces the NF without reducing the gain thereof as shown in FIG. 7B. Thus, the shunt block 30 may shorten the gate width of the first transistor 10, which enhances the NF with suppressing the degradation of the gain. As the third embodiment, the current reuse amplifier with the shunt block 30 is applicable to the triple stage amplifier.

Fourth Embodiment

Figure 8:
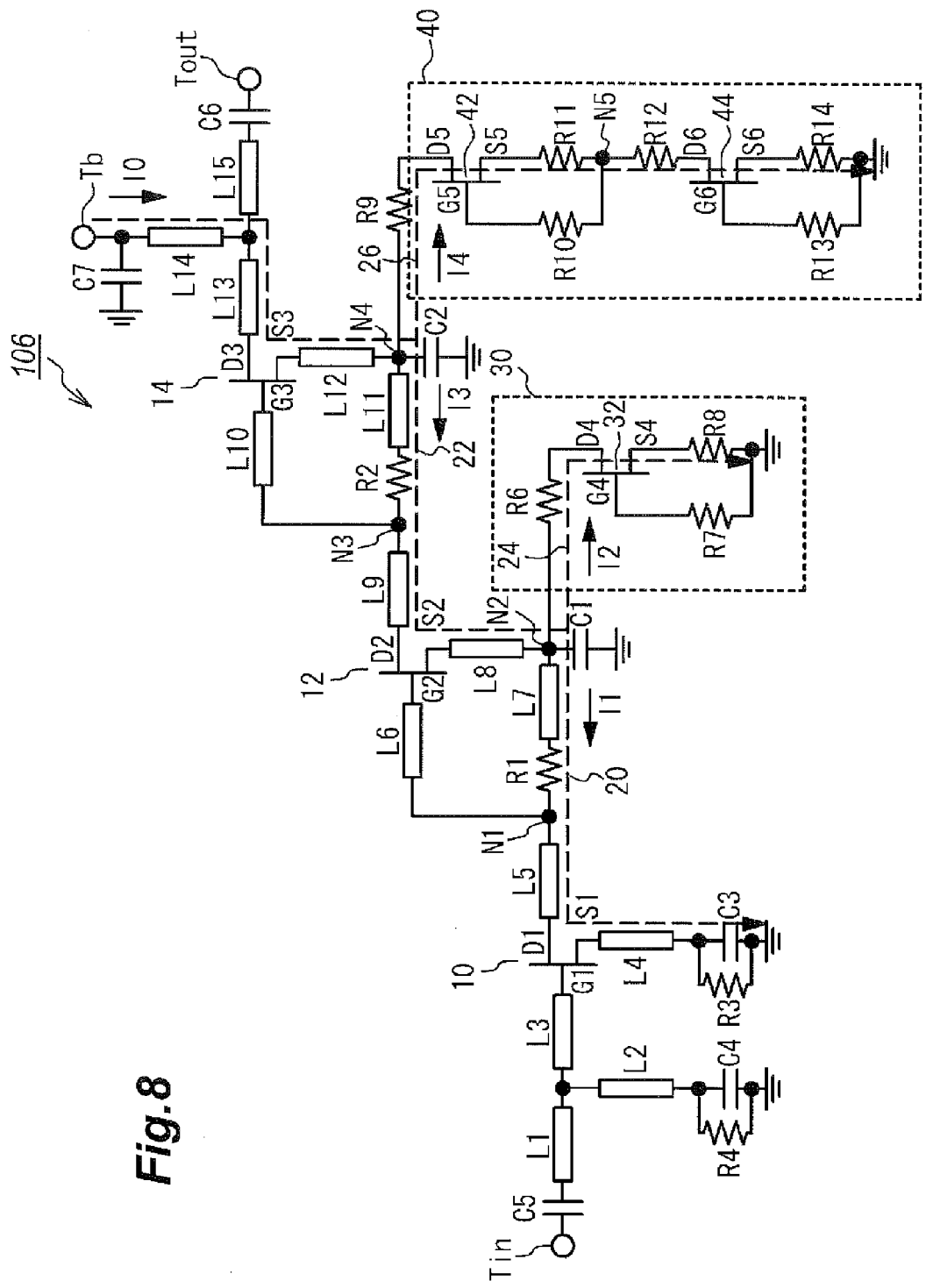
FIG. 8 is a circuit diagram of an amplifier according to the fourth embodiment of the invention.

FIG. 8 is a circuit diagram of an amplifier 106 according to the third embodiment of the invention, where there amplifier 106 provides two shunt blocks. Specifically, the amplifier 106 includes the second shunt block 40 put between the node N4 and the ground. The second shunt block 40 provides two transistors, 42 and 44, and resistors R9 to R14. The transistor 42 is coupled with the node N5 thereof through the resistor R11 in the source S5 but through the resistor R10 in the gate G5, while, it is connected to the node N4 through the resistor R9 in the drain D5. The other transistor 44 in the second shunt block 40 is grounded through the resistor R14 in the source S6 but through the resistor R13 in the gate G6, and it is connected in the drain D6 to the node N5 through the resistor R12. Thus, the resistor R12 is put between two transistors, 42 and 44.

A portion of the DC current I0 flows from the node N4 into the ground through the current path 26, which means that the current I3 flowing in the second transistor 12 becomes smaller than the current I0 flowing in the third transistor 14. Moreover, the current I3 flowing in the second transistor 12 is divided into the current I1 flowing in the first transistor 10 through the path 20 and the shunt current flowing in the first shunt block 30 through the path 24. Accordingly, the former current I1 flowing in the first transistor 10 becomes smaller than the current I3 flowing in the second transistor 12.

Table 5 lists parameters of distributed parameter lines, L1 to L5, the resistance of resistors R1 to R14, the capacitance of capacitors, C1 to C7, sizes of transistors, 12 to 44, and the currents, I0 to I4, appeared in FIG. 8.

TABLE 5

| distributed parameter lines (μm) | L1 | L2 | L3 | L4 | L5 | L6 | L7 | L8 | L9 | L10 | L11 |
|---|---|---|---|---|---|---|---|---|---|---|---|
| | 200 | 90 | 60 | 40 | 170 | 40 | 100 | 10 | 90 | 10 | 80 |
| | L12 | L13 | L14 | L15 | | | | | | | |
| | 10 | 60 | 80 | 120 | | | | | | | |
| Resistor (Ω) | R1 | R2 | R3 | R4 | R6 | R7 | R8 | R9 | R10 | R11 | R12 | R13 |
| | 20 | 10 | 20 | 100 | 20 | 100 | 20 | 10 | 50 | 10 | 10 | 50 |
| | R14 | | | | | | | | | | | |
| | 10 | | | | | | | | | | | |
| Capacitor (pF) | C1 | C2 | C3 | C4 | C5 | C6 | C7 |
| | 1.8 | 1.8 | 1.8 | 1.5 | 0.5 | 0.3 | 3.0 |
| Transistor | 12 | 14 | 16 | 32 | 42 | 44 |
| finger width (μm) | 10 | 20 | 40 | 10 | 20 | 10 |
| finger counts | 4 | 4 | 4 | 4 | 4 | 8 |
| DC Current (mA) | I0 | I1 | I2 | I3 | I4 |
| | 20 | 5 | 5 | 10 | 10 |

The amplifier 106 shown in FIG. 8 sets two currents, I1 and I2, and another two currents, I3 and I4, to be equal to each other. In order to equalize those two currents, I1 and I2, and I3 and I4, the sizes of two transistors, 10, 32 and 44, and those of transistors, 12 and 42, are preferably equal to each other, respectively. Also, the resistance of two resistors, R9 and R2, and that of resistors, R14, R8 and R3, is preferably equal to each other; and the resistance of the resistor R12 is preferably equal to resistance of a parallel circuit of R6 and R1. Then, biases supplied to transistors, 10, 32, and 44, and those to transistors, 12 and 42, become equal to each other. Oppositely, designing the sizes of transistors, 42 and 44, and the resistance of resistors, R9 to R14, the ratio of two current I1 and I2, and that of other two currents, I3 and I4, are optionally set.

In the fifth embodiment, the capacitor C2 is put between the source S3 of the third transistor 14 and the ground, and the resistor R2 is put between two nodes, N3 and N4. The current path, from the external power supply Tb through the third transistor 14 in the drain D3 and the source S3, the node N4, the resistor R2, and the node N3, provides a current to the drain D2 of the second transistor 12. The second shunt block 40 is put in a midway of this current path, namely, between the node N4 and the ground and in parallel to the second transistor 12, which enables to branch the current I0 provided from the external power supply Tb to the ground. Accordingly, the current I3 flowing in the second transistor 12 is smaller than the current TO flowing in the third transistor 14. The second transistor 12 is designed to be smaller, in particular, the gate width thereof, than the third transistor 14.

The shunt blocks, 30 and 40, includes transistors, 32 to 44, operating as a current source, which effectively suppresses the variation of the DC currents, I2 and I4, due to, for instance, the scattering of performances of the transistors, 32 to 44, due to the process instability and/or the temperature dependence of the performances. Moreover, setting the width of the fingers of the transistor 42 to be equal to those of the transistor 12, and those of the transistor 44 to be equal to those of the transistor 10, then, the ratio of the currents, I3 and I4, is easily adjusted by setting the number of the fingers of two transistors, 44 and 10, which effectively facilitates the circuit designing.

Fifth Embodiment

Figure 9:
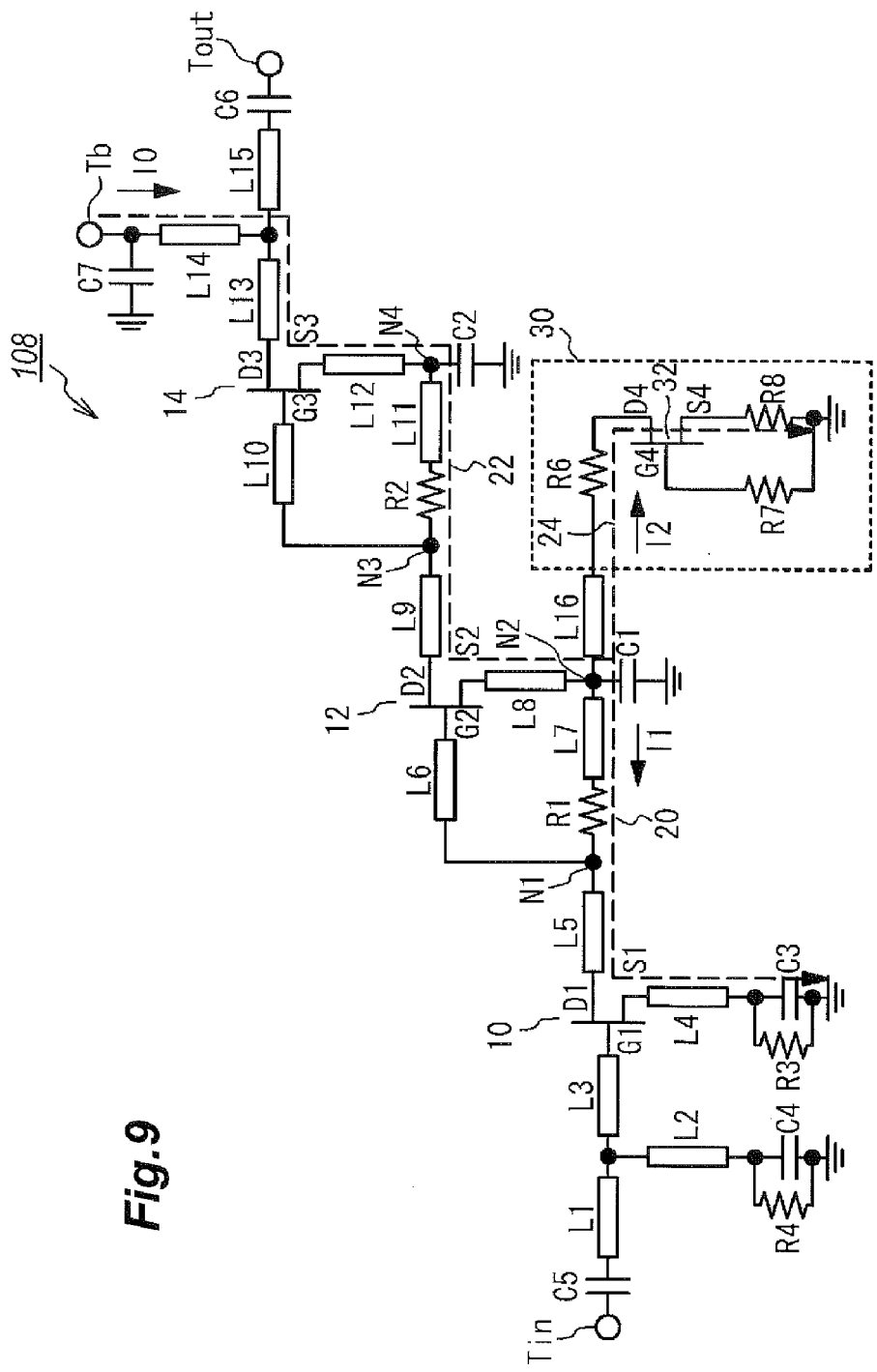
FIG. 9 is a circuit diagram of an amplifier according to the fifth embodiment of the invention.

FIG. 9 is a circuit diagram of an amplifier according to the fifth embodiment of the invention. The amplifier 108 shown in FIG. 9 provides a distributed parameter line L16 between the node N2 and the shunt block 30. Other arrangements of the fifth embodiment are similar to those of the third embodiment shown in FIG. 5.

Table 6 lists circuit parameters of distributed parameter lines, L1 to L16, the resistance of resistors, R1 to R8, the capacitance of capacitors, C1 to C7, sizes of transistors, 12 to 32, and the currents, I0 to I2.

TABLE 6

| distributed parameter lines (μm) | L1 | L2 | L3 | L4 | L5 | L6 | L7 | L8 | L9 | L10 | L11 |
|---|---|---|---|---|---|---|---|---|---|---|---|
| | 140 | 70 | 40 | 40 | 120 | 10 | 80 | 10 | 20 | 10 | 80 |
| | L12 | L13 | L14 | L15 | L16 | | | | | | |
| | 10 | 60 | 80 | 120 | 150 | | | | | | |
| Resistor (Ω) | R1 | R2 | R3 | R4 | R6 | R7 | R8 |
| | 10 | 5 | 10 | 50 | 10 | 50 | 10 |
| Capacitor (pF) | C1 | C2 | C3 | C4 | C5 | C6 | C7 |
| | 1.8 | 1.8 | 1.8 | 1.5 | 0.5 | 0.3 | 3.0 |
| Transistor | 12 | 14 | 16 | 32 |
| finger width (μm) | 20 | 40 | 40 | 20 |
| finger counts | 4 | 4 | 4 | 4 |
| DC Current (mA) | I0 | I1 | I2 |
| | 20 | 10 | 10 |

The amplifier 108 of FIG. 9 provides the distributed parameter line L16 between the shunt block 30 and the current path 20, which suppresses high frequency components from leaking to the shunt block 30 from the current path 20. The distributed parameter line L16 preferably has a length greater than $\lambda/8$ but less than $3\lambda/8$, namely, around a quarter wavelength ($1\lambda/4$) of the wavelength of the high frequency signal to be amplified, which sets the distributed parameter line L15 to be high impedance at the signal wavelength and prevents high frequency signals from leaking to the shunt block 30. In an example, when the high frequency signal is 80 G Hz, a wavelength of $\lambda/8$ and $3\lambda/8$ becomes 150 μm and 450 μm respectively.

Sixth Embodiment

Figure 10:
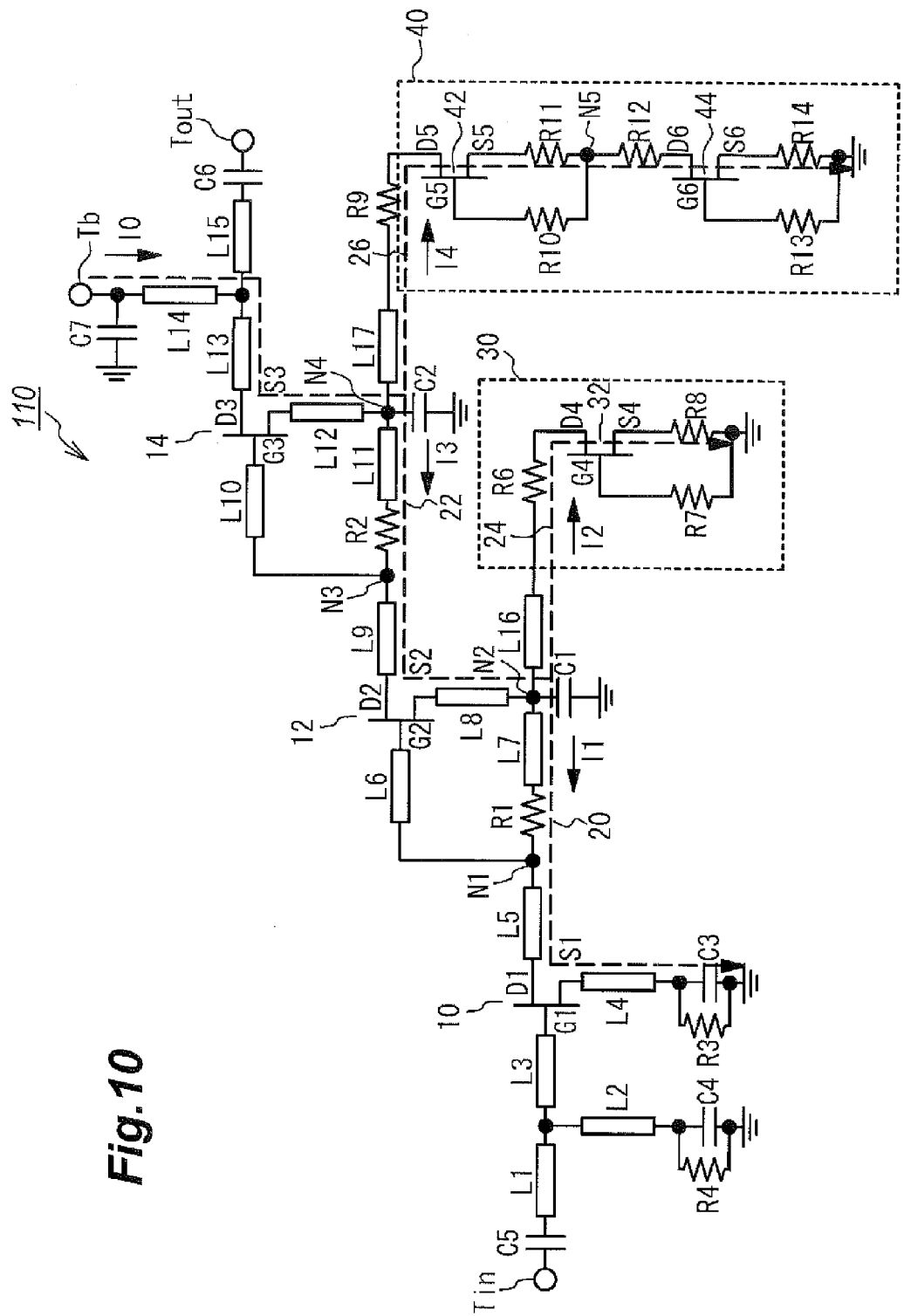
FIG. 10 is a circuit diagram of an amplifier according to the sixth embodiment of the invention.

FIG. 10 is a circuit diagram of an amplifier according to the sixth embodiment of the invention. The amplifier 110 shown in FIG. 10 provides the distributed parameter line L16 between the node N2 and the first shunt block 30, and another distributed parameter line L17 between the node N4 and the second shunt block 40. Other arrangements of the amplifier 110 are similar to those of the amplifier 106 shown in FIG. 8.

Table 7 below lists parameters of distributed parameter lines, L1 to L17, the resistance of resistors, R1 to R14, the capacitance of capacitors, C1 to C7, sizes of transistors, 12 to 44, and the currents, 10 to 14, appeared in FIG. 10.

TABLE 7

| distributed parameter lines (μm) | L1 | L2 | L3 | L4 | L5 | L6 | L7 | L8 | L9 | L10 | L11 |
|---|---|---|---|---|---|---|---|---|---|---|---|
| | 200 | 90 | 60 | 40 | 170 | 40 | 100 | 10 | 90 | 10 | 80 |
| | L12 | L13 | L14 | L15 | L16 | L17 | | | | | |
| | 10 | 60 | 80 | 120 | 150 | 150 | | | | | |
| Resistor (Ω) | R1 | R2 | R3 | R4 | R6 | R7 | R8 | R9 | R10 | R11 | R12 |
| | 20 | 10 | 20 | 100 | 20 | 100 | 20 | 10 | 50 | 10 | 10 |
| | R13 | R14 | | | | | | | | | |
| | 50 | 10 | | | | | | | | | |
| Capacitor (pF) | C1 | C2 | C3 | C4 | C5 | C6 | C7 | | | | |
| | 1.8 | 1.8 | 1.8 | 1.5 | 0.5 | 0.3 | 3.0 | | | | |
| Transistor | 12 | 14 | 16 | 32 | 42 | 44 | | | | | |
| finger width (μm) | 10 | 20 | 40 | 10 | 20 | 10 | | | | | |
| finger counts | 4 | 4 | 4 | 4 | 4 | 8 | | | | | |
| DC Current (mA) | I0 | I1 | I2 | I3 | I4 | | | | | | |
| | 20 | 5 | 5 | 10 | 10 | | | | | | |

The amplifier 110 of FIG. 10 further provides the distributed parameter line L17 between the second shunt block 40 and the node N4 to suppress high frequency signals from leaking to the second shunt block 40. Similar to the distributed parameter line afore mentioned, two distributed parameter lines, L16 and L17, preferably have a length longer than $\lambda/8$ but shorter than $3\lambda/8$, further preferably around $\lambda/4$ of the signal wavelength, which makes the distributed parameter lines, L16 and L17, in high impedance.

Amplifiers, 100 to 110, of the first to sixth embodiments provide transistors, 10 to 44, to have a type of the field effect transistor (FET); however, other types of the transistors may be applicable to the amplifiers. For instance, the type of the bipolar transistor is able to be implemented in the amplifier, 100 to 110. For a bipolar transistor, the emitter, collector, and base correspond to the source, drain, and the gate, respectively, of an FET, and the size of the transistor may be defined by the emitter area. Also, the embodiments aforementioned have the arrangement of the double and triple stage amplifier; however, features of the present invention may be used in a quadrature or more stage amplifier. The distributed parameter lines may be replaced to inductive elements such as a short stub, and have a type of a coplanar line.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed is:

1. An amplifier, comprising:
   a front end stage including a transistor;
   at least one downstream stage including a transistor, wherein the downstream stage and the front end stage are connected in series in DC mode between a power supply and a ground; and
   a shunt block connected in series to the downstream stage and in parallel to the front end stage,
   wherein a DC current flowing in the front end stage is smaller than a DC current flowing in the downstream stage,
   wherein the downstream stage includes a first stage and a second stage connected in series in the DC mode to the first stage, each of the first stage and the second stage including a transistor,
   wherein the amplifier further comprises another shunt block connected in series between the second stage and the ground, the another shunt block being connected in parallel to a circuit of the first stage and the front end stage connected in series to the first stage.

2. The amplifier of claim 1,
   wherein the transistor in the front end stage and the transistor in the downstream stage are a type of a field effect transistor, and
   wherein the transistor in the front end stage has a size smaller than a size of the transistor in the downstream stage.

3. The amplifier of claim 2,
   wherein the transistor in the front end stage has a gate width shorter than a gate width of the transistor in the downstream stage.

4. The amplifier of claim 1,
   wherein the shunt block includes an inductive element connected to the front end stage and the downstream stage.

5. The amplifier of claim 4,
   wherein the inductive element is a distributed parameter line with a length longer than $\lambda/8$ but shorter than $3\lambda/8$, where $\lambda$ is a characteristic wavelength of a high frequency signal to be amplified by the amplifier.

6. The amplifier of claim 1,
   wherein the transistor in the front end stage and the transistors in the first and second stages are a type of a field effect transistor, and
   wherein the transistor in the second stage has a size greater than a size of the transistor in the first stage.

7. The amplifier of claim 6,
wherein the transistor in the second stage has a gate width longer than a gate width of the transistor in the first stage.

8. The amplifier of claim 6,
wherein the transistor in the first stage has a size greater than a size of the transistor in the front end stage.

9. The amplifier of claim 8,
wherein the transistor in the front end stage has a gate width shorter than a gate width of the transistor in the first stage.

10. The amplifier of claim 1,
wherein the another shunt block includes an inductive element connected to the first stage and the second stage.

11. The amplifier of claim 10,
wherein the inductive element is a distributed parameter line with a length longer than $\lambda/8$ but shorter than $3\lambda/8$, where $\lambda$ is a characteristic wavelength of a high frequency signal to be amplified by the amplifier.

12. A current reuse amplifier, comprising:
a first field effect transistor (FET);
a second FET with a source coupled with a gate of the second FET and a drain of the first FET through a first resistor in a DC mode but grounded only in an AC mode;
a shunt block connected in the source of the second FET to shunt a DC current flowing in the second FET to the ground; and
a third FET with a source connected to a drain of the second FET and a gate of the third FET through a second resistor in the DC mode but floated from the ground in the DC mode,
wherein a DC current flowing in the first FET is smaller than a DC current flowing in the second FET, and the first FET has a size smaller than a size of the second FET.

13. The current reuse amplifier of claim 12,
wherein the shunt block includes a resistor.

14. The current reuse amplifier of claim 12,
wherein the shunt block includes a current source comprised of another FET.

15. The current reuse amplifier of claim 12,
wherein the shunt block includes a distributed parameter line with a length greater than $\lambda/8$ but shorter than $3\lambda/8$, where $\lambda$ is a characteristic wavelength of a signal to be amplified by the current reuse amplifier.

16. The current reuse amplifier of claim 12,
further including another shunt block connected in the source of the third FET to shunt the DC current flowing in the third FET to the ground.

17. The current reuse amplifier of claim 16,
wherein the another shunt block includes a current source comprised of another FET.

18. The current reuse amplifier of claim 16,
wherein the another shunt block includes a distributed parameter line with a length greater than $\lambda/8$ but shorter than $3\lambda/8$, where $\lambda$ is a characteristic wavelength of a signal to be amplified by the current reuse amplifier.

\* \* \* \* \*